(12) United States Patent
Sturland et al.

(10) Patent No.: US 8,663,789 B2
(45) Date of Patent: Mar. 4, 2014

(54) THIN FILM GETTER DEVICES

(75) Inventors: Ian Michael Sturland, Bristol (GB); Tracey Anne Hawke, Bristol (GB)

(73) Assignee: BAE SYSTEMS plc, London (GB)

( * ) Notice: Subject to any disclaimer, the term of this patent is extended or adjusted under 35 U.S.C. 154(b) by 983 days.

(21) Appl. No.: 12/159,828

(22) PCT Filed: Nov. 28, 2007

(86) PCT No.: PCT/GB2007/004559
§ 371 (c)(1),
(2), (4) Date: Jul. 1, 2008

(87) PCT Pub. No.: WO2008/071906
PCT Pub. Date: Jun. 19, 2008

(65) Prior Publication Data
US 2009/0081434 A1    Mar. 26, 2009

(30) Foreign Application Priority Data

Dec. 15, 2006  (EP) ..................................... 06270102
Dec. 15, 2006  (GB) .................................. 0625060.9

(51) Int. Cl.
*B32B 7/02*    (2006.01)
*C23C 14/34*   (2006.01)

(52) U.S. Cl.
USPC ....................... 428/218; 428/212; 204/192.12

(58) Field of Classification Search
USPC ............................. 428/218, 212; 204/192.12
See application file for complete search history.

(56) References Cited

U.S. PATENT DOCUMENTS

| | | | |
|---|---|---|---|
| 5,814,241 A  * | 9/1998 | Reutova et al. | 252/181.1 |
| 6,923,625 B2 | 8/2005 | Sparks | |
| 2003/0107317 A1 | 6/2003 | Touchberry et al. | |
| 2003/0138656 A1 | 7/2003 | Sparks | |
| 2004/0253476 A1 | 12/2004 | Conte et al. | |
| 2006/0087232 A1* | 4/2006 | Ramamoorthi et al. | 313/549 |

FOREIGN PATENT DOCUMENTS

| | | |
|---|---|---|
| EP | 1 518 599 A2 | 3/2005 |
| WO | WO 00/39525 | 7/2000 |
| WO | WO 02/27058 A1 | 4/2002 |
| WO | WO 03/009317 A2 | 1/2003 |
| WO | WO 2006/089068 A2 | 8/2006 |

OTHER PUBLICATIONS

Thornton, J.A., "Influence of apparatus geometry and deposition conditions on the structure and topography of thick sputtered coatings", J. Vac. Sci. Technol., Jul./Aug. 1974, pp. 666-670, vol. 11, No. 4.
Li, Chien-Cheng, et al., "Fabrication and characterization of non-evaporable porous getter films", Surface and Coatings Technology, Nov. 21, 2005, pp. 1351-1355, vol. 200, No. 5-6.
Choa, S. H., "Reliability of Vacuum Packaged MEMS Gyroscopes", Microelectronics Reliability, (2005) pp. 361-369, V. 45, Elsevier Ltd.

* cited by examiner

*Primary Examiner* — Maria Veronica Ewald
*Assistant Examiner* — Laura Auer
(74) *Attorney, Agent, or Firm* — Scully, Scott, Murphy & Presser, PC (57) ABSTRACT

Improved thin film getter devices (300, 500) comprise a layer (350, 550) of getter material deposited on a substrate (320, 520). The layer has a main portion (340, 540) and a cap portion (360, 560), which forms an external surface of the device. The cap portion has a lower specific area than the main portion.

8 Claims, 5 Drawing Sheets

ically concerned with thin film getters obtained by sputtering.
THIN FILM GETTER DEVICES This invention relates to thin film getters, and to a method of manufacture of thin film getters. This invention is particularly concerned with thin film getters obtained by sputtering.

Getter materials are highly reactive materials that are used in vacuum technology applications to improve the quality of a vacuum. Commonly used getter materials are titanium, zirconium, niobium, tantalum, and vanadium; and alloys or compounds thereof with one or more elements selected from aluminium, transition metal elements or rare earths, such as binary alloys including titanium-vanadium, and zirconium-aluminium, or ternary alloys such as zirconium-vanadium-iron. Getters function by reacting chemically with the trace gases present in the vacuum environment. For example, oxides and nitrides of the getter material may be formed where there are traces of oxygen and nitrogen in the vacuum environment. One particular application of getter materials is in the field of micromachined devices, where it can frequently be necessary to employ vacuum packaging. In order to overcome problems associated with outgassing from the devices, in-situ getters are used to absorb any products of outgassing. One particular example relates to the manufacture of micromachined capacitive gyroscopes, such as those described in EP1163490. The Q-factor of the oscillation in such structures is sensitive to pressure, and, in particular, falls dramatically with increasing pressure. It is therefore important to maintain a stable, high vacuum around the vibrating structure. This is partly achieved through the use of an in situ getter device. In such applications, it is desirable for the getter device to be able to absorb a large a quantity of gas. Often, this can be achieved by ensuring that the getter material has a high porosity—i.e. a large specific area.

A known problem with getter devices is that of activation: it is necessary to ensure that the getter device can be made active in-situ. A highly reactive getter material will develop a passivating oxide layer rapidly if exposed to normal atmospheric conditions, thus becoming useless as a getter in vacuum conditions. Various solutions to this problem have been proposed. For example, Sparks proposed, in U.S. Pat. No. 6,923,625, the covering of a reactive material with a layer of a substantially non-reactive material. Where the non-reactive layer is sufficiently thin, appropriate heating causes the reactive material to become interdiffused with the non-reactive material, to the extent that at least a portion of the reactive material is able to react with getter gases from the surrounding atmosphere. An alternative solution, disclosed by SAES Getters S.p.A in their European Patent Application Publication No. 1518599, is to provide a getter multilayer formed of a layer of a first non-expandable getter alloy having a low activation temperature over a layer of a second different, non-evaporable getter material having high specific surface. The multilayer getter is produced under vacuum conditions, such that the second getter alloy is never exposed to atmosphere during subsequent handling. Only the first getter alloy is exposed. Subsequent activation needs take place at the low activation temperature of the first getter alloy. Both of the above solutions exhibit the disadvantage that the getter device necessarily comprises a number of different materials. This complicates the manufacturing process, particularly where a sputtering process is used during manufacture.

It is accordingly an aim of the present invention to mitigate at least some of the above-mentioned problems with prior-known getter devices. It is a further aim of the invention to provide a getter device that is simpler to manufacture than prior known getter devices, and to provide a getter device that can be simply activated when required.

In broad terms, the present invention resides in the concept of a getter device produced through sputtering in which the properties of the getter device are tailored through appropriate control of sputtering parameters during manufacture of the device. Such devices can be manufactured using only one getter material, and yet can still be substantially protected from atmospheric conditions during handling, and activated in situ in, for example, a micromaching environment, when required.

In accordance with a first aspect of the invention, there is provided a thin film getter device comprising a layer of getter material deposited on a substrate, the layer having a first portion and a cap portion forming an external surface of the device, the cap portion having a lower specific area than the first portion. In accordance with a second aspect of the invention, there is provided a thin film getter device comprising a layer of getter material deposited on a substrate, the layer having a main portion and a cap portion forming an external surface of the device, the cap portion having a lower specific area than the main portion. The cap portion reduces the level of oxidation of the main portion of the getter device during normal handling. A key advantage of the present invention is that both the cap portion and the main portion are fabricated from the same getter material, for example titanium, resulting in a much simpler fabrication process than possible with prior-known getter devices, whilst still enabling a cap portion to be present to facilitate handling of the getter device in normal conditions. Rather than using a different material to form the cap portion, the present invention uses the same material deposited under different conditions to result in a cap portion in the form of a layer of material having different physical properties to the main portion of the getter device.

In one embodiment of the invention, the cap portion has a substantially uniform specific area. Alternatively, the cap portion may have a specific area that varies between a first value at a boundary between the first portion and the cap portion, and a second value at the external surface of the device, the second value being lower than the first value.

In accordance with a third aspect of the invention, there is provided a method of manufacturing a thin film getter device comprising sputtering getter material onto a substrate, the sputtering comprising the steps of: sputtering a first portion of getter material using a first set of sputtering conditions; and sputtering a cap portion of getter material using a second set of sputtering conditions; the first set of sputtering conditions being configured to produce a resultant layer of higher specific area than that produced using the second set of sputtering conditions. In accordance with a fourth aspect of the present invention, there is provided a method of manufacturing a thin film getter device comprising sputtering getter material onto a substrate, the sputtering comprising the steps of (a) sputtering a main portion of getter material using a first set of sputtering conditions; and (b) sputtering a cap portion of getter material using a second set of sputtering conditions; the first set of sputtering conditions being configured to produce a resultant layer of lower density than that produced using the second set of sputtering conditions. Thus the main portion of the layer of getter material is deposited directly onto the substrate, and the cap portion is deposited onto the main portion. Conveniently, the sputtering conditions can be changed during a continuous sputtering process, with no need to expose the getter device to normal atmospheric conditions during its fabrication.

The first set of sputtering conditions may comprise a first pressure, and the second set of sputtering conditions may comprise a second, lower pressure. It has been found that variation of the pressure provides a particularly simple manner in which to vary the physical properties of the sputtered layer of getter material between the main portion and the cap portion. In alternative embodiments, the first set of sputtering conditions may comprise a lower temperature than the second set of sputtering conditions.

The second set of sputtering conditions may comprise the application of a continuously varying pressure, which pressure decreases from a first pressure equal to that used in the first set of sputtering conditions to a second pressure. In one particular exemplary embodiment described below, the pressure decreases linearly from the first pressure to the second pressure.

The invention extends to a vibrating structure gyroscope, such as a capacitive gyroscope, comprising a getter device as described above.

The above and further features of the invention are set forth with particularity in the accompanying claims, and will be described in detail in the following with reference to various exemplary embodiments that are illustrated in the accompanying drawings, in which:

Figure 1:
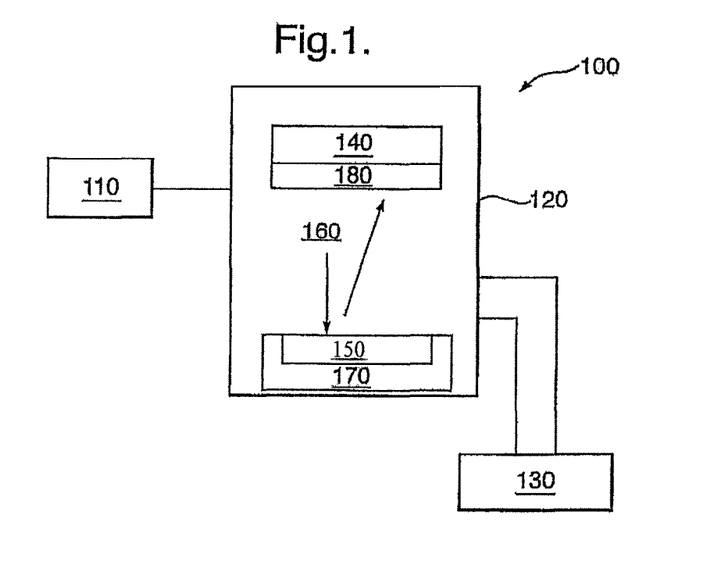
FIG. 1 is a schematic diagram of sputtering apparatus.

Getter devices according to embodiments of the present invention are fabricated using sputter deposition techniques. Sputter deposition, also known as cathodic deposition, is a wellknown technique that is widely used in the semiconductor and optics industries for the deposition of thin films of material. A schematic diagram of sputter deposition apparatus 100 is shown in FIG. 1, and its operation will be briefly explained in the following. A gas source 110 is provided for a chamber 120, which is maintained at a low pressure by means of a vacuum pump 130. The gas is an inert gas, for example argon. The chamber holds a substrate 140, and a target 150. The process gas supplied from the gas source is ionised within the vacuum chamber 120, and the resulting positively charged ions 160 are accelerated towards the target 150 under the influence of an electric field due to anode 170. The ions collide with the target 150 to eject target material in the direction of the substrate 140. Target material collects on the substrate resulting in the growth of a thin film 180 of target material on the substrate 140.

The rate of growth and the quality of the film 180 depend critically on the actual configuration of the sputtering apparatus that is used. A number of important parameters can be identified. The size and configuration of the chamber influences the cleanliness of the system through the out-gassing rate, which is partly determined by the surface-area to volume ratio of the chamber. The geometric relationship of the target to the substrate influences the thin film growth rate, and, through the path length between the target and the substrate, will affect the energy of the target material when incident on the substrate. The uniformity of the resulting thin film is also influenced as a result of geometric variation in the ejection of material from the target The choice of vacuum pump used will set the attainable base pressure in the system, therefore influencing the overall cleanliness of the system, and, through setting of the gas volume pump speed, determines the cleanliness of the process gas. These features in turn may influence the thin film morphology, for example by the pinning of grain boundaries at impurities, or influencing the density of nucleation sites. One example of a vacuum pump that can be used in sputtering systems is the cryo pump. The cryo pump uses liquid helium to solidify any gases present in the system, and, for sputtering systems, has the advantage that a relatively clean vacuum is produced.

The choice of process gas determines the ease of plasma formation through the ionisation energy of the process gas, and also determines the kinetic energy of ejected target material through the atomic mass of the process gas. The choice of process gas pressure limits the actual energy of both ions incident on the target and target particles incident on the substrate through variation of the number of scattering collisions that take place in the chamber. The choice of target material influences deposition rate, uniformity and kinetic energy of ejected target material.

Figure 2:
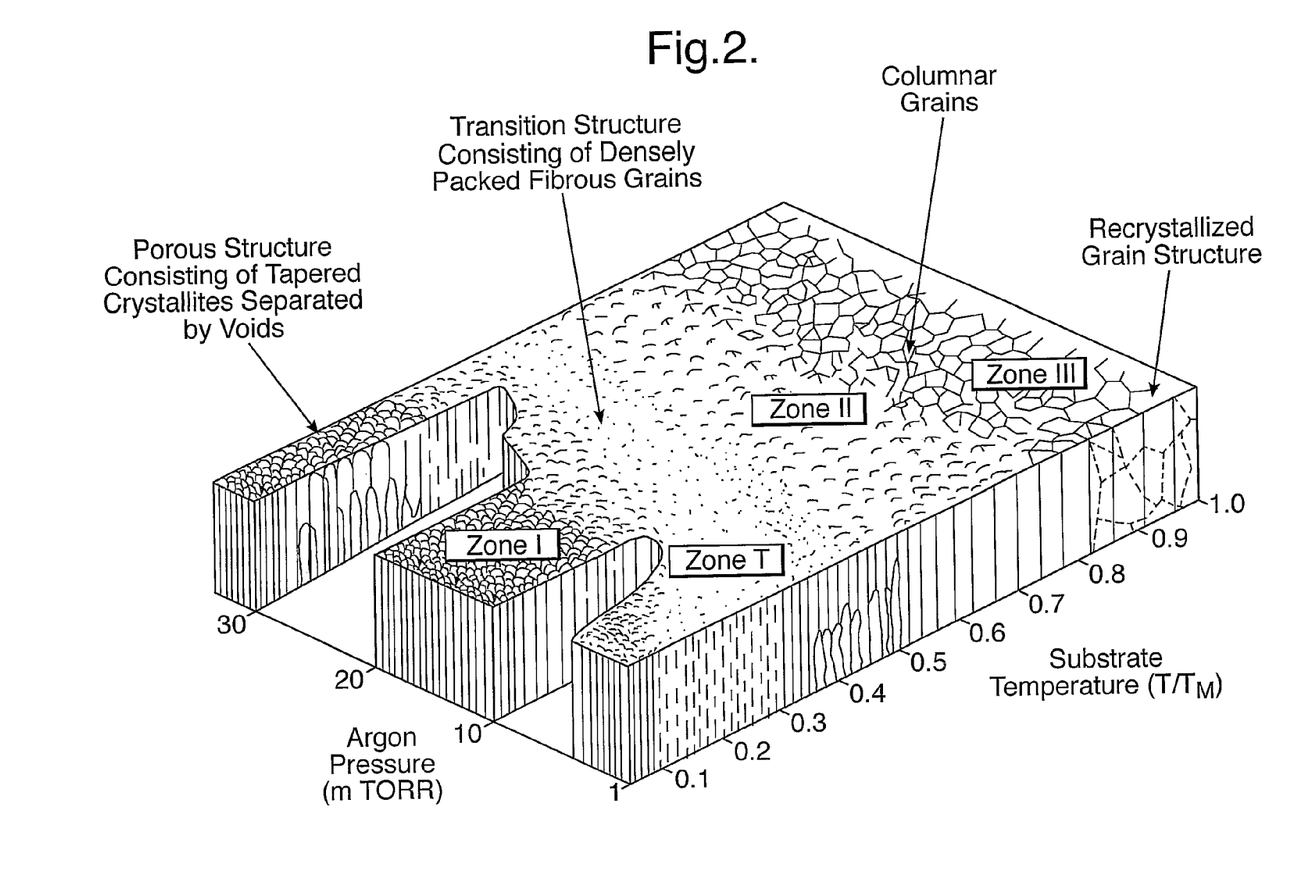
FIG. 2 is a schematic diagram indicating the general variation of the microstructure of a sputtered thin film with pressure and temperature.

The growth mechanisms of thin films, and particularly sputtered thin films, are often described by the Zone Model, also known as the Thornton Model, that is described in J. A. Thornton, J. Vac. Sci. Technol. 11, p666 (1974), and that is schematically illustrated in FIG. 2. According to this model, three distinct microstructures (Zone I, Zone II and Zone III microstructures) can be obtained, with an additional transitional zone (the Zone T microstructure) between zone I and II. The model describes how the microstructure of the thin film obtained changes in dependence on the conditions in which the film is sputtered, parameterising those conditions in terms of substrate temperature, measured relative to the melting point of the target material, and sputter pressure. Zone I microstructures, obtained in low energy conditions (high pressure and low temperature), are characterised by a tapered grain structure, which arises out of a random set of nucleation sites at which growth occurs competitively, resulting in touching, domed "grains" that are not strongly inter-bonded. Under more energetic conditions (lower pressure and higher temperature), Zone T microstructures, and then Zone II microstructures are obtained. The transition between 1 and 11 occurs at a temperature of around $\frac{1}{3} T_m$, as can be seen from FIG. 2. In the transitional zone, the grains are more densely packed than in Zone I, and have a fibrous structure, Zone II microstructures have a yet more densely packed, columnar grain structure that has faceted surfaces and much stronger inter-bonding between the grains. As the conditions become more energetic, and there is sufficient energy to allow a degree of re-crystallisation to occur, Zone III microstructures are obtained, in which there are larger, columnar grains. The transition from Zone I to Zone III microstructures occurs at around $\frac{1}{2} T_m$, as can be seen from FIG. 2. It is noted that the transitional temperatures also vary with pressure resulting in the two dimensional zone model shown in FIG. 2.

Generally, sputter deposition processes are arranged to produce Zone II or Zone III microstructures, in order to produce films that exhibit mechanical strength, high density, and low resistivity. However, in the production of getter devices, open, porous structures having a high specific area are required, and therefore sputtered thin films having a Zone I microstructure are likely to be more effective getters. Less energetic conditions (higher pressure and/or lower temperatures) are needed in order to manufacture effective getter devices. As those skilled in the art will immediately appreciate, higher density structures will have a lower specific area, whilst lower density structures will have a higher specific area.

Figure 3:
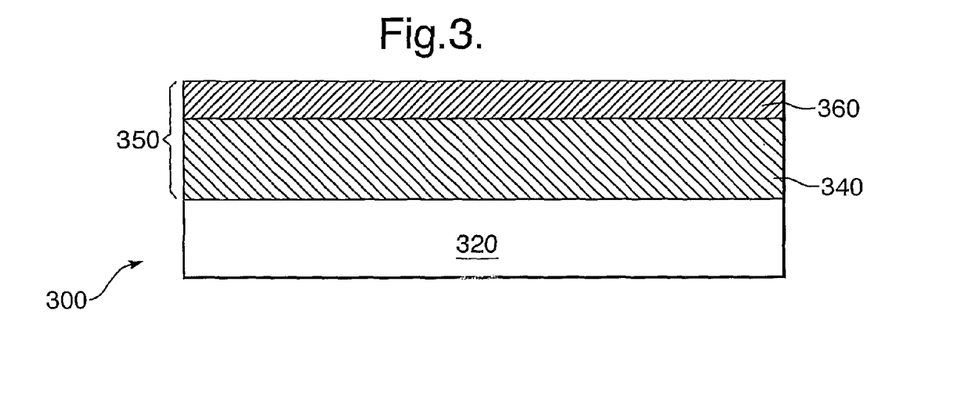
FIG. 3 is a schematic diagram of a getter device in accordance with a first embodiment of the invention.

FIG. 3 shows a schematic diagram of getter device 300 in accordance with a first embodiment of the invention. The getter device comprises substrate 320, and getter material in the form of a layer referenced generally 350, which layer comprises a main portion 340, and a cap portion 360. The getter material in the present embodiment is titanium, and the getter device is produced by sputtering titanium onto the substrate 320 to form the thin film 350, which is of the order of 1 μm thick. The main portion 340 of the layer, which forms the bulk of the thin film 350, is formed using sputtering conditions arranged, as described in further detail below, to result in an open, porous structure, with a high specific area, that will exhibit high getter activity. The cap portion 360 is much thinner than the main portion, of the order of 0.01 μm to 0.1 μm. It is formed using conditions arranged, as described in further detail below, to result in a denser microstructure having a lower specific area, and therefore a lower getter activity, than the main portion 340. The cap portion forms an external surface of the getter device, and so, when the getter device is exposed to atmospheric conditions, the getter material in the cap portion rapidly oxidises. However, since the cap portion has only limited porosity, the bulk of the getter device in the main portion 340 of the layer 350 is protected from oxidation when the device is handled under normal atmospheric conditions.

Once exposed to atmospheric conditions, the device 300 must be activated in order to function as a getter in a vacuum environment. In order to be activated, the getter material in the main portion 340 must be exposed. Experiment has shown that this can be accomplished by heating the device to a temperature of 450° C. It is currently thought that this activation is due either to thermal expansion of the getter device resulting in the grain structure of the cap portion 360 opening up and exposing the main portion 340, or because further grain growth at the higher temperature results in a coarsening of the grain structure that increases the intergrain porosity, Alternatively, the activation could be a result of diffusion of the thin surface layers of the cap portion in to the bulk, thereby exposing fresh material. Other mechanisms, however, may be responsible.

The device 300 is fabricated in a CVC601 sputtering system obtained from CVC Products Inc., of 525 Lee Road, P.O. Box 1888, Rochester, N.Y. 14603, USA. It is a cryo-pumped batch-loaded multiple-substrate deposition machine, with three 8" Magnetron targets in a sputter up configuration. The substrates are held on a rotatable partially thermally isolated carousel, which can hold either twelve 4" wafers, or eight 5" wafers.

It has been found previously that conventional, dense, low resistivity titanium films can be obtained in the CVC601 system using a DC sputter power of 500 W in an argon atmosphere of pressure 8 mTorr. Pre-processing, in which a ramp-up of sputter power from 0 W to 500 W is applied over 10 minutes, is used to remove potentially-contaminated material on the surface of the target. For the titanium targets used for the fabrication of embodiments of the present invention, there is expected to be a thin layer of oxide on the surface of the target. During pre-processing, the shutter in front of the substrate is kept shut such that this potentially-contaminated material is sputtered onto the back of the shutter. At the end of pre-processing, the shutter is automatically moved and a timed deposition sequence started. Titanium films were deposited directly onto a silicon substrate, with a shadow mask used to define the position of the deposited getter layer. No sputter etch was carried out. No special measures were taken to ensure good adhesion of the titanium to the substrate, since titanium has a high reactivity and is therefore expected to chemically bond with the substrate surface. Experimentally, it was found that good adhesion was obtained under all deposition conditions.

As described above in relation to the Zone Model, sputtering in less energetic conditions generally results in a more open, more porous structure that is preferable where gettering activity is desired. In the CVC601 system used for the present example, direct control of the substrate temperature is not possible, and so only indirect temperature control is possible. Such indirect control can be achieved by changing the sputtering power, which would result in a lower degree of self-heating, but is unlikely to be sufficient to provide the magnitude of temperature control necessary for significant microstructural changes to be achieved in the case of titanium, which has a high melting point (1660° C.). In any event, the temperature in the CVC601 system is neither precisely controllable nor precisely measurable. The sputter pressure, however, can be controlled directly, and is also expected to result in significant changes to the microstructure of the resulting thin film. By increasing the sputter pressure from the 8 mTorr used for standard titanium deposition, a microstructure having a more open structure and lower density is obtained. Such a microstructure exhibits a higher specific surface area available for gettering chemistry to occur.

The main portion 340 of device 300 illustrated in FIG. 3 is the first part of the film to be deposited onto the substrate, and is deposited using a sputter pressure of 14 mTorr, that is significantly greater than the 8 mTorr pressure used in the fabrication of standard thin titanium films, and using a sputter power of 500 W for 100 minutes to achieve a thickness of approximately 1 μm. The cap portion 360 is formed by reducing the sputter pressure to 8 mTorr and continuing deposition at 500 W for 1-10 minutes to achieve a cap thickness of approximately 0.01-0.1 μm. The cap portion is therefore significantly thinner than the first portion. By depositing the cap portion at the lower pressure of 8 mTorr, more energetic conditions are achieved, and therefore, as explained above, a denser microstructure is obtained. Both the cap portion 360 and the main portion 340 are therefore fabricated in one continuous deposition process, with the advantage that the first portion is not exposed to atmospheric conditions during fabrication. Post-fabrication, the main portion 340 is protected from atmospheric conditions by cap portion 360. Moreover, the fabrication of the device 300 can be carried out for lower cost than that of prior known protected getter devices since both the first, main portion of the device 300, and is the protecting cap portion, are fabricated in a single continuous process using a single material.

Figure 4:
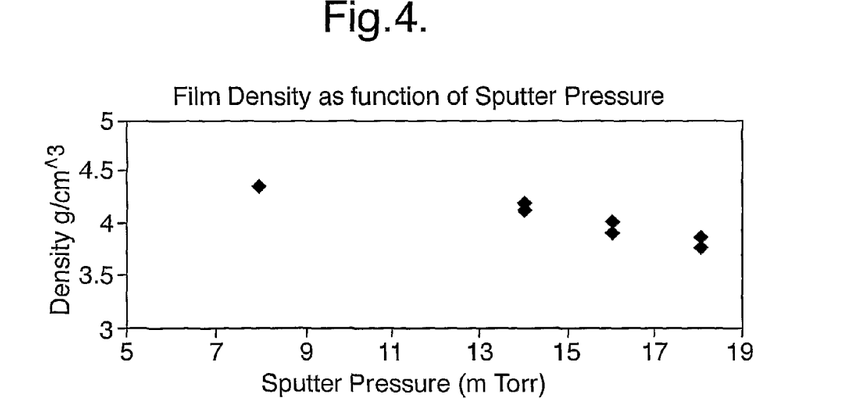
FIG. 4 is a graph indicating the variation of density of as-sputtered titanium thin films with sputter pressure.

Measurements of film density were taken for a number of titanium thin films deposited at a variety of sputter pressures to confirm that more porous structures are obtained when using higher sputter pressures. The results are shown graphically in FIG. 4, and show that an increase of pressure from 8 mTorr to 18 mTorr had the effect of reducing the resultant film density from 4.4 g/cm$^3$ to 3.9 g/cm$^3$. Even at the lower pressure, the film density is less than that of bulk titanium (4.507 g/cm$^3$), but is notable that a reduction in density of approximately 0.5 g/cm$^3$ (over 10%) is achieved by the pressure increase applied. The reduced density is an indication of a more open, and therefore more porous, microstructure. Such a microstructure is thus expected to have a higher specific area and therefore better gettering activity than more dense microstructures.

Figure 5:
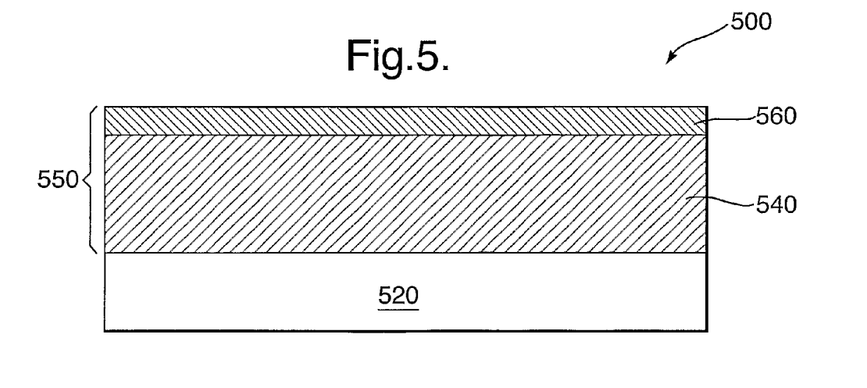
FIG. 5 is a schematic diagram of a getter device in accordance with a second embodiment of the invention.

A getter device 500 in accordance with a second embodiment of the invention is shown in FIG. 5. The device 500 is very similar to the device 300 of the first embodiment shown in FIG. 3, and like parts are referenced with the same numerals as used in FIG. 3, with an increment of 200. Device 500 comprises a substrate 520, and a layer of getter material 550 that is shown divided into a main portion 540 and a cap portion 560. Device 500, in fact, differs significantly from device 300 only in cap portion 560, which has a graded density profile, so that there is no distinct line of demarcation between the structural properties of the main, porous, portion 540, and those of the cap portion 560, but instead a gradual increase in the density of the film on moving through the cap portion, from a first value equal to that of the main portion, to a second, higher value at the surface of the getter device. There is therefore a corresponding decrease in porosity on moving through the cap portion 560 to the surface of the getter device. In contrast to the first embodiment of the invention, the specific area of the microstructure of the getter device is continuous across the boundary between the main portion and the cap portion.

Device 500 is fabricated in the CVC601 sputtering system as described above in relation to the fabrication of the device 300. The fabrication process is substantially the same, except in that the pressure is not switched from 14 mTorr to 8 mTorr during the last ten minutes of the sputtering process, but is instead linearly decreased from 14 mTorr to 8 mTorr during the last ten minutes of the sputtering process, to result in the graded structure of the cap portion 560 that is described above.

Figure 6A:
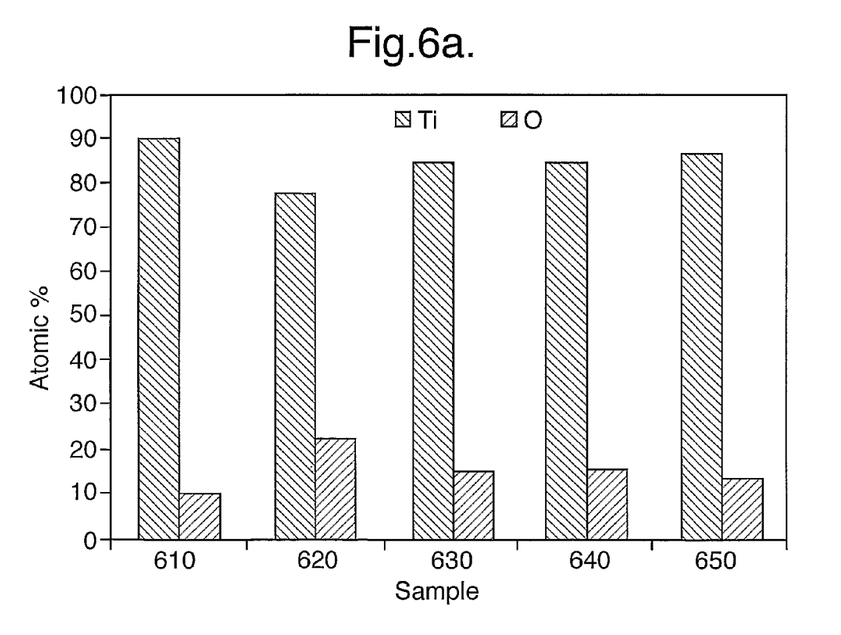
FIGS. 6a and 6b are graphs comparing the getter activity of a number of embodiments of the invention.
Figure 6B:
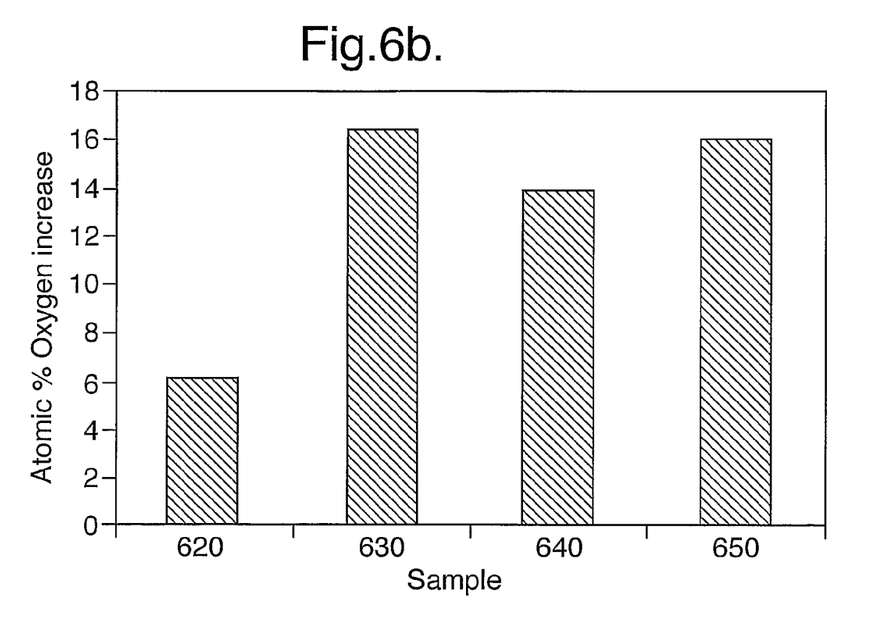

In order to demonstrate the effectiveness of the getter devices, energy dispersive x-ray analysis was performed on a number of sputtered films both as-deposited and after exposure to oxygen at 450° C. for fifty minutes. The results of these tests are shown in FIGS. 6a and 6b. FIG. 6a shows the atomic percentages of titanium and oxygen in a number of as-deposited getter devices standard titanium film (results labelled 610), a porous titanium film (results labelled 620), a porous titanium film with a thin (uniform) cap of standard titanium film (results labelled 630), a porous titanium film with a thick (uniform) cap of standard titanium film (results labelled 640), and a porous titanium film with a graded cap in accordance with the second embodiment of the invention (results labelled 650). In each case, the bar on the left hand side indicates the amount of titanium present in the films by atomic percentages and the bar on the right indicates the amount of oxygen present by atomic percentages. The thin cap has a thickness of approximately 0.01 μm, resulting from a deposition time of 1 minute, whilst the thick cap has a thickness of approximately 0.1 μm, resulting from a deposition time of 10 minutes.

As can be seen, a significant amount of oxygen is incorporated into the films even at the as-deposited stage. This oxygen is present as a result of outgassing in the vacuum chamber of the CVC601 sputtering chamber. Since the CVC601 system is a batch-loaded system, the internal vacuum chamber must be exposed to the external atmosphere each time it is opened. Load-locked systems, in contrast, are expected to have cleaner vacuum chambers since it is not necessary to expose the internal vacuum chamber to the external atmosphere so regularly, and thus it might be expected that getter devices produced in a load-locked system would exhibit lower oxygen incorporation than is shown in the results presented in FIGS. 6a and 6b. Notably, no argon was found to be incorporated into any of the films, despite the higher argon pressure used during the sputtering of the more porous sections of the films, despite the energy dispersive x-ray analysis being expected to be sensitive to argon levels at 1% atomic or more.

The standard metal film fabricated by deposition at 8 mTorr (results labelled 610) show the lowest oxygen incorporation (at 9.9% atomic). The porous metal film results labelled 620 (deposition at 14 mTorr) show that the porous film has more than double the oxygen content of the standard metal film (approximately 22.3% atomic), demonstrating the improved porosity of films deposited at higher pressures. The capped structures (results labelled 630, 640, and 650) have significantly lower oxygen content (15.2% atomic, 15.5% atomic and 13.4% atomic for samples 630, 640, and 650 respectively) than the porous metal, but still greater oxygen incorporation than the standard metal films. Of the capped films, the graded cap (results labelled 650) exhibits the lowest oxygen incorporation at approximately 13.4%.

In order to demonstrate that the capped films could be activated to expose the underlying porous layer, further energy dispersive x-ray analysis was carried out on each of the samples tested subsequent to exposure to oxygen gas at 450° C. for 50 minutes. In the formation of a capacitive gyroscope, exposure to a temperature of 450° C. is expected at the anodic bond stage in the manufacture of the gyroscope. FIG. 6b shows the percentage increase in atomic percentage of oxygen incorporated in the films after this exposure, as determined by EDX analysis. As the samples were the same as in FIG. 6a, the same reference numerals are used to refer to the samples as in FIG. 6a. The porous film (results labelled 620) exhibits the lowest increase in oxygen content of 6.2%. The thick-capped sample (results labelled 640) exhibits a significantly larger increase in oxygen content of 13.9%, whilst the thin capped (results labelled 630) and the graded cap (results labelled 650) samples exhibit greater-still increases in oxygen content of 16.5% and 16.1% respectively. Thus all the capping treatments significantly improve the gettering performance of the devices, as compared to the porous structure. The slightly poorer performance of the thick-capped structure is thought to be due to poorer break-up of the cap on heating to 450° C.

Preliminary tests of getters in accordance with embodiments of the invention in complete vibrating structure gyroscopes have resulted in encouraging performance. Such gyroscope structures comprise a vibrating a silicon substantially planar ring vibrating structure and capacitive means for imparting drive motion to, and sensing motion of, the vibrating structure, as is disclosed in EP1163490, and are suitable for manufacturing by micromachining techniques. The vibrating ring structure is enclosed within a vacuum package formed at a late stage in the manufacture of the gyroscope. It is necessary to ensure that the vibrating structure is in an ambient pressure that is kept as low as possible in order that the Q-factor of its oscillations is kept as high as possible. Getter devices as described above can be used to maintain a stable, low pressure in the package despite outgassing from other components of the structure. The getter is incorporated into the "lid" of the package, and activation occurs during the bonding of the lid to the base of the structure, on which the vibrating ring is formed.

Having described various specific embodiments of the invention, it is to be noted that the above-described examples are in all respects exemplary, and that variations and modifications from the above embodiments are possible without departing from the scope of the invention, which is defined in the accompanying claims. For example, those skilled in the art will immediately recognise that the exact configuration of getter devices according to embodiments of the invention can readily be altered as desired through adjustment of the porosities of the various portions of the getter layers, the thickness of the cap portion, and the gradient of porosity applied to the cap portion through the control of the sputtering pressure. Furthermore, whilst it has been described above to use titanium as the getter material, it is noted that it is possible to fabricate getter devices according to the present invention using getter materials other than titanium, such as, for example, those getter materials disclosed hereinabove.

Moreover, it is noted that, whilst the above sputtering parameter values are suitable for the CVC601 sputtering system described above, these parameters will not necessarily transfer immediately to other sputtering systems. For example, the pressures used for the above-described embodiments of the invention cannot be simply carried over to other sputtering systems since the absolute pressure value necessary to achieve the optimum microstructure will vary with the other parameters of the sputtering system as is described above. Furthermore, it is expected that, even in the CVC601 system described above, it may be possible to produce lower density, and therefore higher specific area and higher porosity, titanium films by further increasing the pressure used in the deposition of the main portion of the getter film.

Most production sputtering systems use cluster configurations and single wafer processing at much higher target powers than used in the CVC601 sputtering system described above, in order to achieve high throughput and dense, highly-conductive films. In their standard production configuration the deposition rate may be so high that the pressures required to achieve porous films may not be achievable before the pump set reaches its maximum gas throughput. In the case of the commonly used cryo pump the large gas load may cause the pump to stop functioning. However, as those skilled in the art will readily appreciate, such problems can be overcome by using lower sputtering powers, and appropriately engineered gas conductance to control vacuum pump speeds. Those skilled in the art will further be readily able to perform the necessary optimisation in order to produce getter devices according to the present invention in any sputtering system. It is noted, however, that it may be necessary to use non-standard configurations for such production sputtering systems.

The invention claimed is:

1. A thin film getter device comprising a layer of getter material deposited on a substrate, the layer having a main portion and a cap portion forming an external surface of the device, the cap portion having a lower specific area than the main portion, wherein the cap portion and the main portion each have a same composition of the getter material and the crystalline structure of the layer of getter material transitions from the main portion comprising tapered crystallites separated by voids to the cap portion comprising of columnar grains.

2. A device as claimed in claim 1, wherein the main portion is deposited onto the substrate, and the cap portion is deposited onto the main portion.

3. A device as claimed in claim 1, wherein the cap portion has a substantially uniform specific area.

4. A device as claimed in claim 1, wherein the cap portion has a specific area that varies between a first value at a boundary between the main portion and the cap portion, and a second value at the external surface of the device, the second value being lower than the first value.

5. A device as claimed in claim 1, wherein the getter material is titanium.

6. A device as claimed in claim 1, wherein the cap portion has a higher density than the main portion.

7. A device as claimed in claim 6, wherein the main portion is protected from atmospheric conditions by the higher density of the cap portion.

8. A device as claimed in claim 1, wherein the main portion and the cap portion are deposited by sputtering.

* * * * *